United States Patent
Yamashita et al.

(10) Patent No.: US 7,432,530 B2
(45) Date of Patent: Oct. 7, 2008

(54) SOLID-STATE IMAGING DEVICE AND METHOD OF MANUFACTURING SAME

(75) Inventors: Atsuko Yamashita, Kanagawa-ken (JP); Toshihiko Kitamura, Kanagawa-ken (JP); Takashi Doi, Kanagawa-ken (JP); Masaaki Ogawa, Kanagawa-ken (JP); Takayuki Sakai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/751,807

(22) Filed: May 22, 2007

(65) Prior Publication Data
US 2007/0275496 A1 Nov. 29, 2007

(30) Foreign Application Priority Data
May 25, 2006 (JP) .............................. 2006-145495

(51) Int. Cl.
H01L 29/04 (2006.01)
H01L 29/15 (2006.01)
H01L 31/036 (2006.01)
H01L 29/10 (2006.01)
H01L 31/0376 (2006.01)
H01L 31/20 (2006.01)
H01L 31/062 (2006.01)
H01L 31/113 (2006.01)
H01L 31/06 (2006.01)
H01L 27/148 (2006.01)
H01L 29/74 (2006.01)
H01L 29/768 (2006.01)

(52) U.S. Cl. .................... 257/72; 257/59; 257/222; 257/223; 257/291; 257/292; 257/293; 257/294; 257/461; 257/462

(58) Field of Classification Search ................... 257/59, 257/72, 222–223, 291–294, 461–462
See application file for complete search history.

(56) References Cited

U.S. PATENT DOCUMENTS 7,115,913 B2 * 10/2006 Shigeno ....................... 257/91

(Continued)

FOREIGN PATENT DOCUMENTS

JP 6-224398 8/1994

(Continued)

OTHER PUBLICATIONS

U.S. Appl. No. 11/751,807, filed May 22, 2007, Yamashita et al.

(Continued)

*Primary Examiner*—Ida M Soward
(74) *Attorney, Agent, or Firm*—Oblon, Spivak, McClelland, Maier & Neustadt, P.C.

(57) ABSTRACT

A solid-state imaging device includes: a substrate; a photo-receiving portion formed in the substrate; a wiring layer formed on the substrate and having a trench being formed on a region directly above the photo-receiving portion; and a light guiding member provided in the trench and made of organic material. An empty space is formed between a side wall of the trench and a side surface of the light guiding member. The side surface of the light guiding member is curved so that a central part of the side surface along a vertical direction is closer to a center axis of the trench than both end parts of the side surface along the vertical direction.

14 Claims, 9 Drawing Sheets

U.S. PATENT DOCUMENTS

| | | | |
|---|---|---|---|
| 7,265,328 B2 * | 9/2007 | Mouli | 250/208.1 |
| 2006/0273359 A1 * | 12/2006 | Mori | 257/291 |
| 2007/0007563 A1 * | 1/2007 | Mouli | 257/292 |

FOREIGN PATENT DOCUMENTS

| | | |
|---|---|---|
| JP | 2003-60179 | 2/2003 |
| JP | 2005-175072 | 6/2005 |

OTHER PUBLICATIONS

U.S. Appl. No. 11/778,314, filed Jul. 16, 2007, Ogawa et al.

* cited by examiner

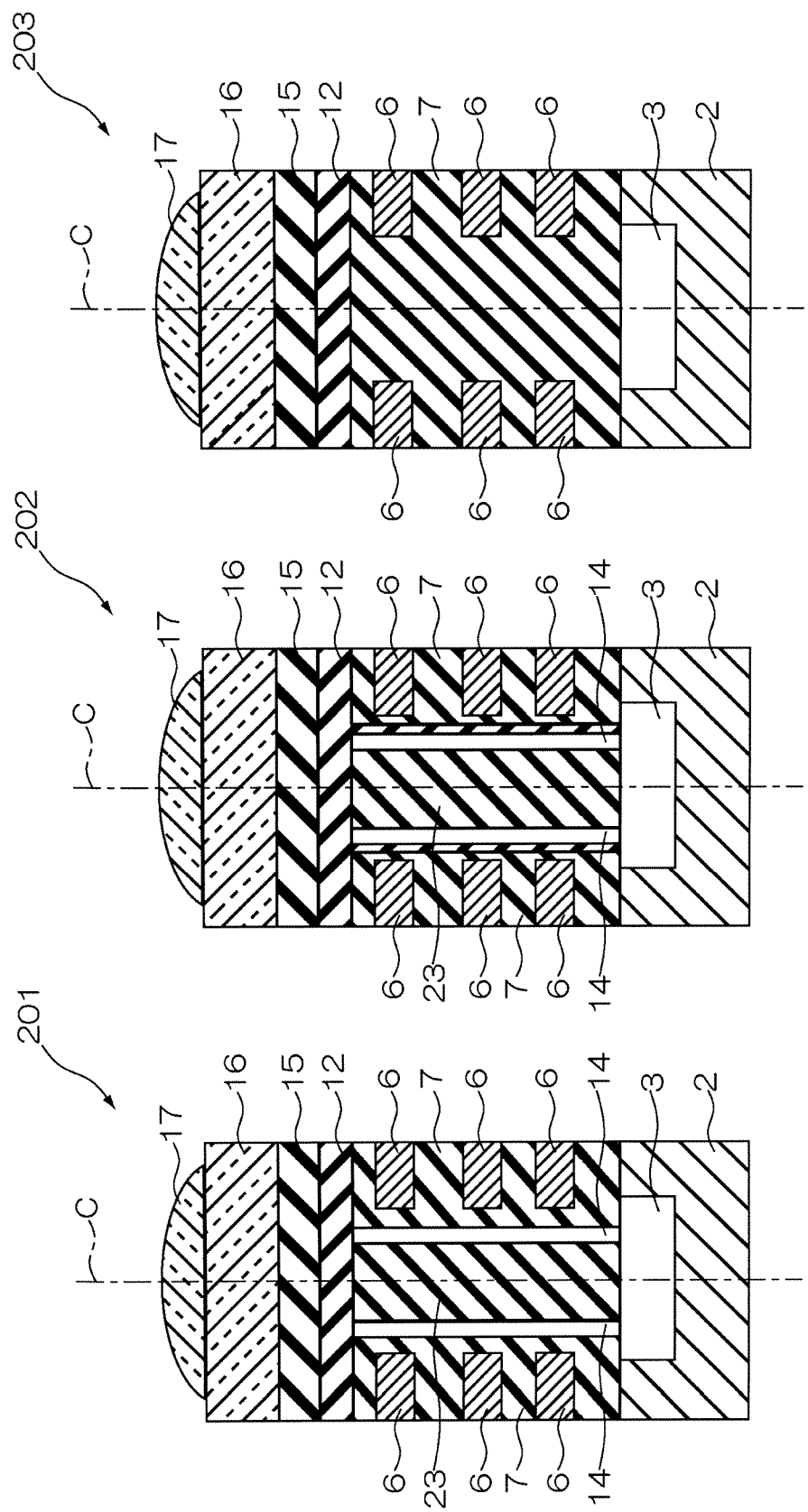

SOLID-STATE IMAGING DEVICE AND METHOD OF MANUFACTURING SAME

CROSS-REFERENCE TO RELATED APPLICATIONS

This application is based upon and claims the benefit of priority from the prior Japanese Patent Application No. 2006-145495, filed on May 25, 2006; the entire contents of which are incorporated herein by reference.

BACKGROUND OF THE INVENTION

1. Field of the Invention

This invention relates to a solid-state imaging device and a method of manufacturing the same and more particularly to a solid-state imaging device introducing light to photo-receiving portions formed on a substrate through a light guiding member and a method of manufacturing the same.

2. Background Art

Recently, installing digital cameras on mobile terminals such as mobile phones is generalized. Such imaging devices of digital cameras are required to be low in power consumption and to be small in size. CMOS (Complementary Metal Oxide Semiconductor) type area sensors are receiving attention as imaging devices meeting these requirements.

In a CMOS type area sensor, photo-receiving portion being comprised of a photodiode or the like, a charge detecting circuit, a amplification circuit and a noise reduction circuit and all are formed on a surface portion of a silicon substrate, thereafter a multi-wiring layer is formed on the silicon substrate and a trench is formed directly above a region of the photo-receiving portion in the multi-wiring layer, and then a light guiding member for guiding light into a photo-receiving portion is placed in the trench. Furthermore, the multi-wiring layer has wiring layers having about 2 to 3 layers and an interlayer between wiring layers is insulated by an interlayer insulating film.

When the CMOS area sensor is downsized to increase a number of pixels of the digital camera like this, the area of each photo-receiving portion inevitably becomes smaller. On the other hand, to prevent a signal delay in wirings and mixing of noise, providing enough distance between wiring layers is necessary and a definite height is required for multi-wiring layers. As a result, aspect ratios of the trench increase along with downsizing of sensors. When aspect ratios of the trench increase, light incident at an angle into the trench goes into the multi-wiring layer from the side wall of the trench and is reflected by wirings arranged in the multi-wiring layer, and then becomes harder to arrive at the photo-receiving portion. Therefore, downsizing sensors causes effective introduction of light into the photo-receiving portion to be difficult.

Thus, there is a proposed technology of collecting effectively light incident into the trench to the photo-receiving portion by formation of an empty space (air layer) between the side wall of the trench and the side surface of the light guiding member and reflecting the light at an interface between the light guiding member and the air layer (for example, see JP 06-224398A and JP 2003-060179A). In technologies described in JP 06-224398A and JP 2003-060179A, the empty space is formed between the side wall of the trench and the side surface of the light guiding member by forming a dummy layer on the side wall of the trench and then removing the dummy layer after forming the photo-receiving member.

However, in technologies described in JP 06-224398A and JP 2003-060179A, a complicated process is needed for formation of the empty space as described above, thus productivity of sensors is low. Moreover, since process errors are accumulated every process, shape stability of the empty space is low.

SUMMARY OF THE INVENTION

According to an aspect of the invention, there is provided a solid-state imaging device including: a substrate; a photo-receiving portion formed in the substrate; a wiring layer formed on the substrate and having a trench being formed on a region directly above the photo-receiving portion; and a light guiding member provided in the trench and made of organic material, an empty space being formed between a side wall of the trench and a side surface of the light guiding member, and the side surface of the light guiding member being curved so that a central part of the side surface along a vertical direction is closer to a center axis of the trench than both end parts of the side surface along the vertical direction.

According to another aspect of the invention, there is provided a method of manufacturing a solid-state imaging device including; forming a photo-receiving portion in a substrate; forming a wiring layer on the substrate; forming a trench in the wiring layer directly above the photo-receiving portion; embedding organic material in the trench; and forming an empty space between a side wall of the trench and a side surface of a light guiding member with a formation of the light guiding member by curing the organic material by heating the organic material.

BRIEF DESCRIPTION OF THE DRAWINGS

FIGS. 8A to C are cross sections showing CMOS sensors intended for calculation in simulation.

DETAILED DESCRIPTION OF THE INVENTION

An embodiment of the invention will now be described with reference to the drawings.

Figure 1:
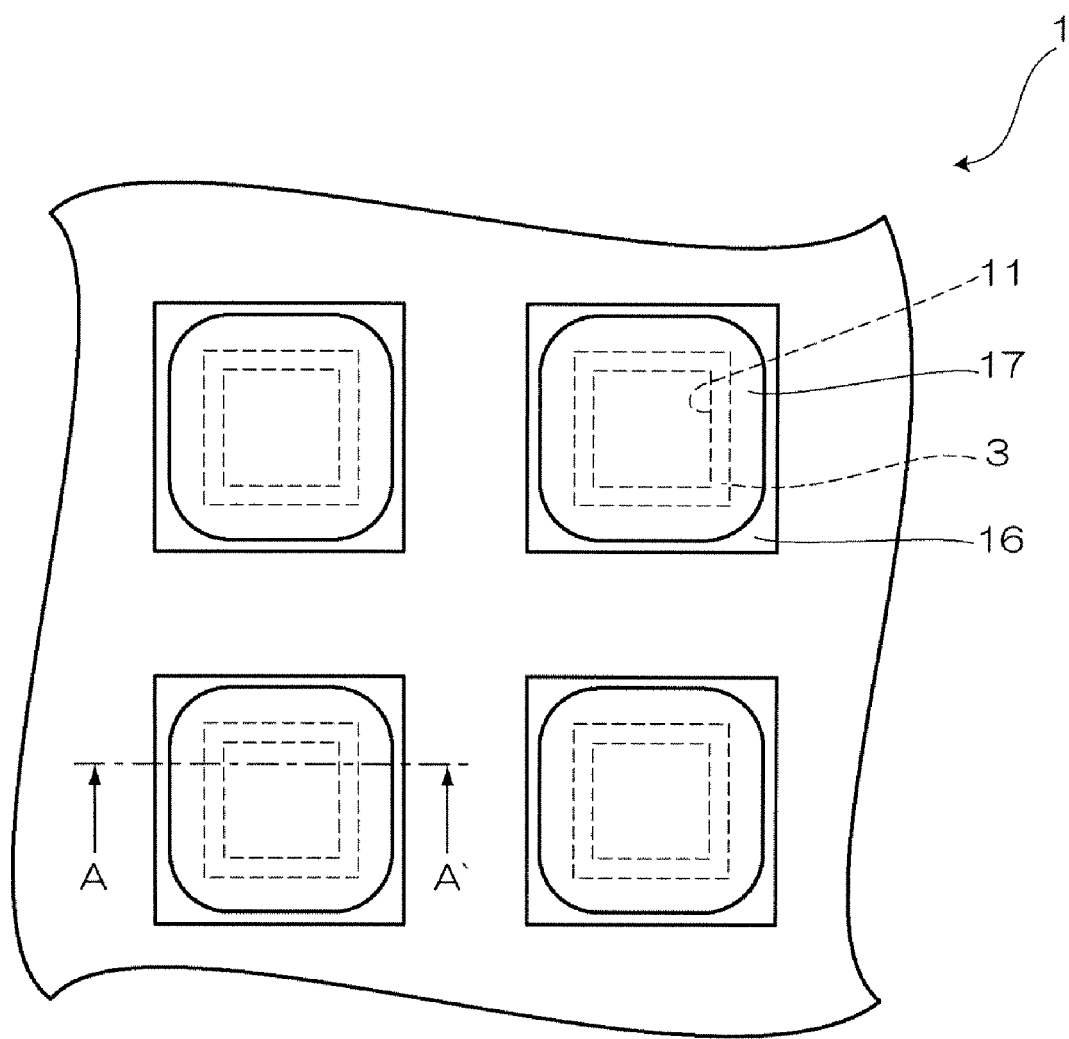
FIG. 1 is a plan view illustrating a CMOS sensor according to an embodiment of the invention.
Figure 2:
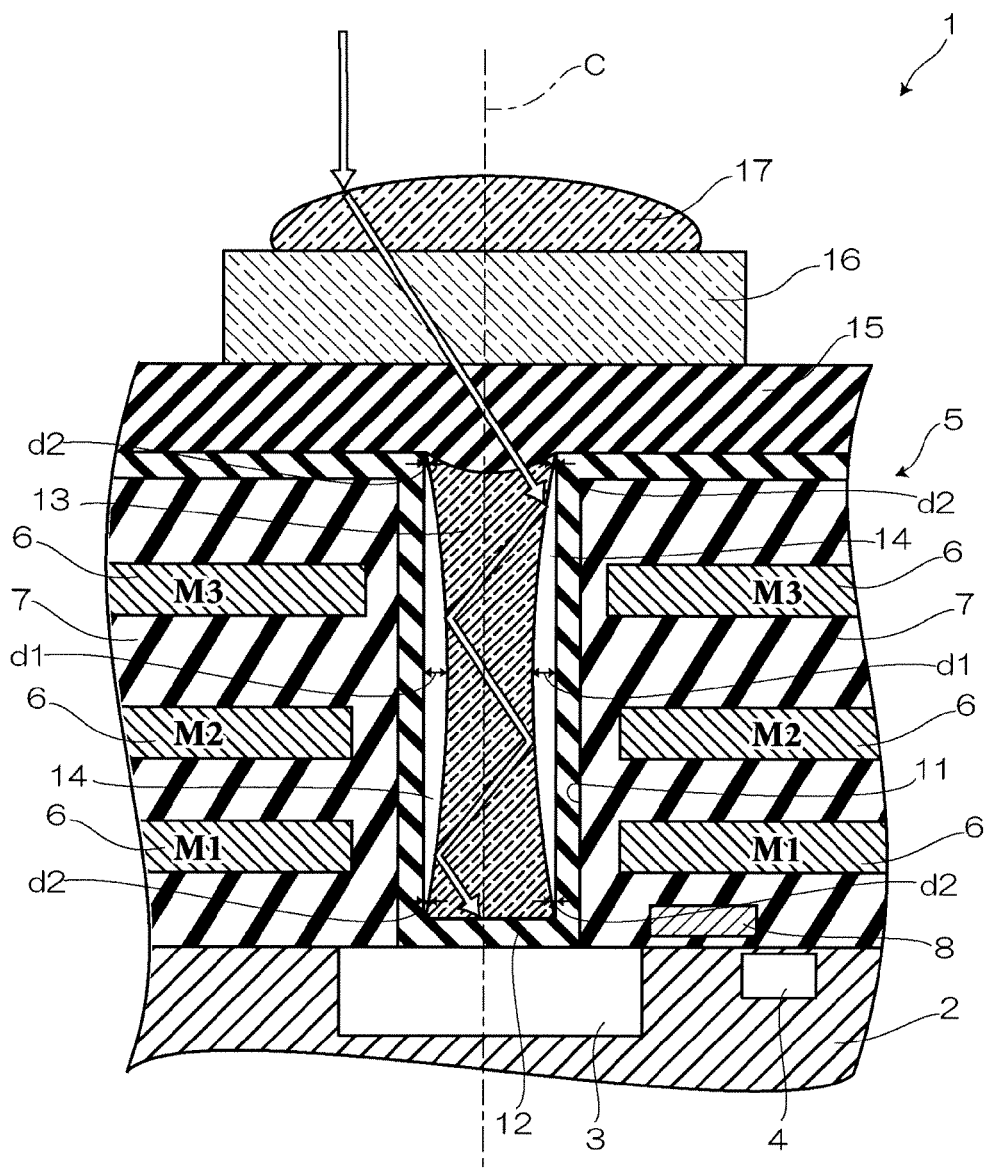
FIG. 2 is a cross section illustrating the CMOS sensor along line A-A' in FIG. 1.

FIG. 1 is a plan view illustrating a CMOS type area sensor (hereinafter referred to as only 'CMOS sensor') as a solid-state imaging device according to this embodiment, FIG. 2 is a cross section illustrating the CMOS sensor along line A-A' in FIG. 1.

As shown in FIG. 1 and FIG. 2, in a CMOS sensor 1 according to the embodiment, a silicon substrate 2 is provided and a photodiode 3 as a photo-receiving portion is formed on a surface portion of the silicon substrate 2. Watching from a direction perpendicular to the surface of the substrate 2 (hereinafter referred as to 'on high'), a shape of the photodiode 3 is, for example, square and plural photodiodes 3 are arranged in a matrix configuration. Moreover, a transfer circuit 4 is formed near to photodiodes 3 on the surface portion of the silicon substrate 2. Furthermore, various circuits (not shown) such as a charge detecting circuit, an amplification circuit and a noise reduction circuit and all are formed on the surface portion of the silicon substrate 2.

Moreover, a multi-wiring layer 5 is provided on the silicon substrate 2. In the multi-wiring layer 5, plural, for example, wiring layers of 3 layers are stacked and a wiring 6, for example, of aluminum is provided in each wiring layer. This wiring 6 is for driving each circuit described above and transferring detected signals. Furthermore, in FIG. 2, the wiring 6 formed in the first wiring layer counted from the side of the silicon substrate 2 is taken as a wiring M1, the wiring 6 formed in the second wiring layer is taken as a wiring M2 and the wiring 6 formed in the third wiring layer is taken as a wiring M3. An interlayer insulating film 7 is provided in a part between wiring layers in the multi-wiring layer 5 and a part between wirings 6 in each wiring layer. Thus, the interlayer insulating film 7 insulates among wirings 6. Moreover, a control electrode 8 controlling transfer of a signal from the photodiode 3 to the transfer circuit 4 is provided on a region directly above the region between the photodiode 3 and the transfer circuit 4 in the multi-wiring layer 5.

Furthermore, a trench 11 passing through the multi-wiring layer 5 is formed on a part of the region directly above the photodiode 3 in the multi-wiring layer 5. Watching from on high, a shape of the trench 11 is, for example, square and a center axis C of the trench 11 is extending vertically to the surface of the silicon substrate 2. A thickness of the multi-wiring layer 5 is, for example, from 2 to 3 micrometers, therefore a depth of the trench is also from 2 to 3 micrometers. On the other hand, a width of the trench 11 is, for example, 0.7 micrometers. And a nitride film 12 of, for example, OP-SiN (Optical Plasma-SiN) is formed so as to cover a bottom surface and a side wall of the trench 11, and a top surface of the multi-wiring layer 5.

Furthermore, a light guiding member 13 is buried in the trench 11. The light guiding member 13 is made of organic material, for example, of organic SOG (Spin on Glass) material, for example, of polyimide. It is preferable that a refractive index of organic material forming the light guiding member 13 is from 1.4 to 1.8. The side surface of the light guiding member 13 is curved so that a central part along a vertical direction approaches the center axis of the trench 11 rather than both ends. That is to say, the side surface of the light guiding member 13 is concave. Thus, an empty space 14 is formed between the nitride film 12 formed on the side wall of the trench 11 and the light guiding member 13. A shape of the empty space 14 is in a configuration of a convex lens expanding toward the center axis of the trench 11 in a cross section including the center axis of the trench 11. That is, a width d1 at the central part of the empty space 14 along the vertical direction is larger than a width d2 at the upper end and the lower end and, for example, the upper end and the lower end of the side surface of the light guiding member 13 are contact with the nitride film 12. Moreover, the under surface of the light guiding member 13 adheres to the silicon substrate 2. The empty space 14 is filled with, for example, air and nitrogen or the like.

A planarizing film 15 is provided on the protecting film 12 and the light guiding member 13. The upper surface of the light guiding member 13 adheres to the planarizing film 15. Moreover, a color filter 16 is provided on the planarizing film 15 including the region directly above the trench 11 and a micro lens 17 is provided on the color filter 16. The color filter 16 allows only the light in the specified wave length to pass through it and the micro lens 17 is a convex lens which collects the light incident from on high into the trench 11.

Watching from on high, the outer edge of the color filter 16 is out of the outer edge of the micro lens 16 and the outer edge of the micro lens 17 is out of the inner side surface of the trench 11. Moreover, the outer edge of the photodiode 3 is out of the inner side surface of the trench 11. And then, watching from on high, center axes of the trench 11, the light guiding member 13, the color filter 16 and the micro lens 17 coincide each other.

Next, a method of manufacturing the CMOS sensor 1 according to the embodiment configured mentioned above will be described.

FIGS. 3 to 6 are process cross sections illustrating the method of manufacturing the CMOS sensor 1 according to the embodiment in the order of the processes.

Figure 3:
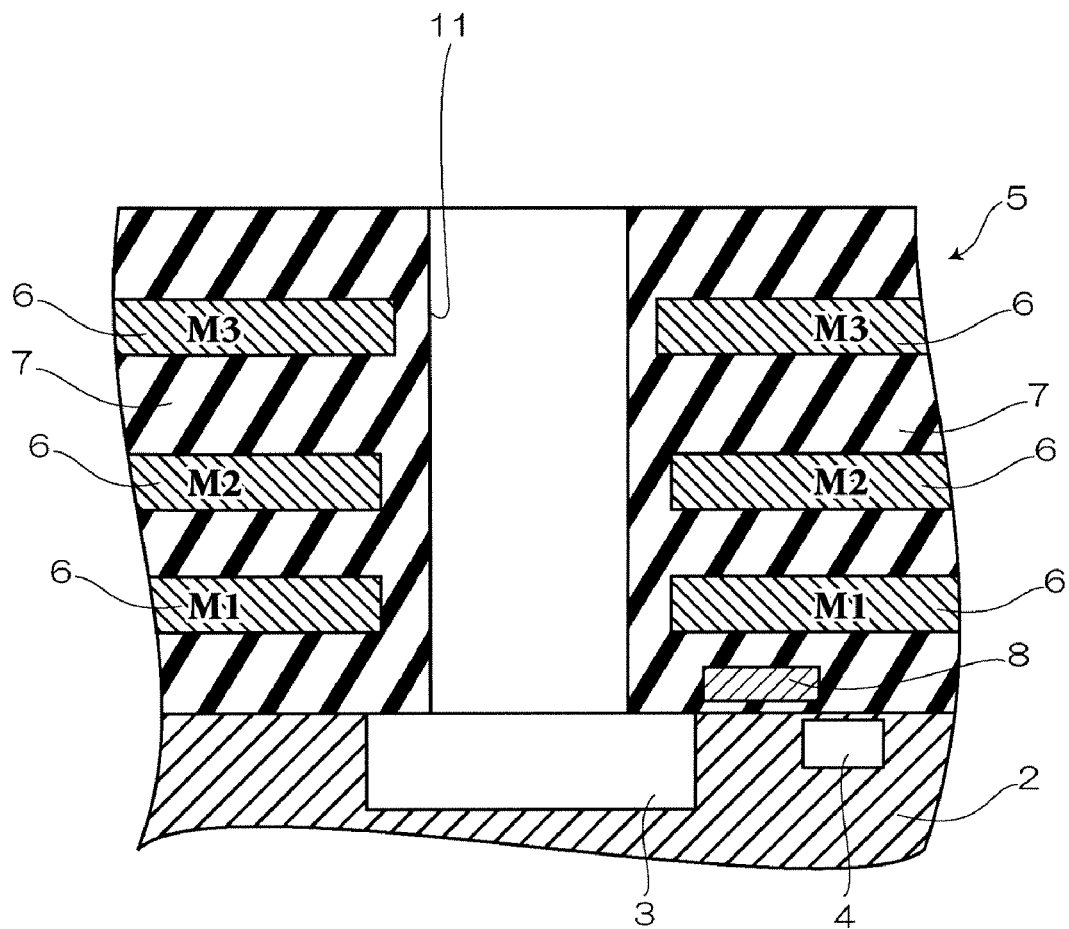
FIG. 3 is a process cross section illustrating a method of manufacturing a CMOS sensor according to the present embodiment.

At first, as shown in FIG. 3, various circuits such as a photodiode 3 as a photo-receiving portion, a transfer circuit 4, a charge detecting circuit (not shown), an amplification circuit (not shown) and a noise reduction circuit (not shown) and all are formed on the surface portion of the silicon substrate 2. Next an interlayer insulating film 7 of, for example, silicon oxide or the like is deposited on the silicon substrate 2 and a gate electrode 8 is formed. After that, the deposition of the interlayer insulating film 7 and the formation of the wiring 6 are repeated and then a multi-wiring layer 5 is formed including wirings M1 to M3 in the interlayer insulating film 7. At this moment, the wiring 6 formation is avoided directly above the photodiode 3. Next, a part of the multi-wiring layer 5 directly above the photodiode 3 in is removed by etching and a trench 11 is formed so as to arrive at the silicon substrate 2.

Figure 4:
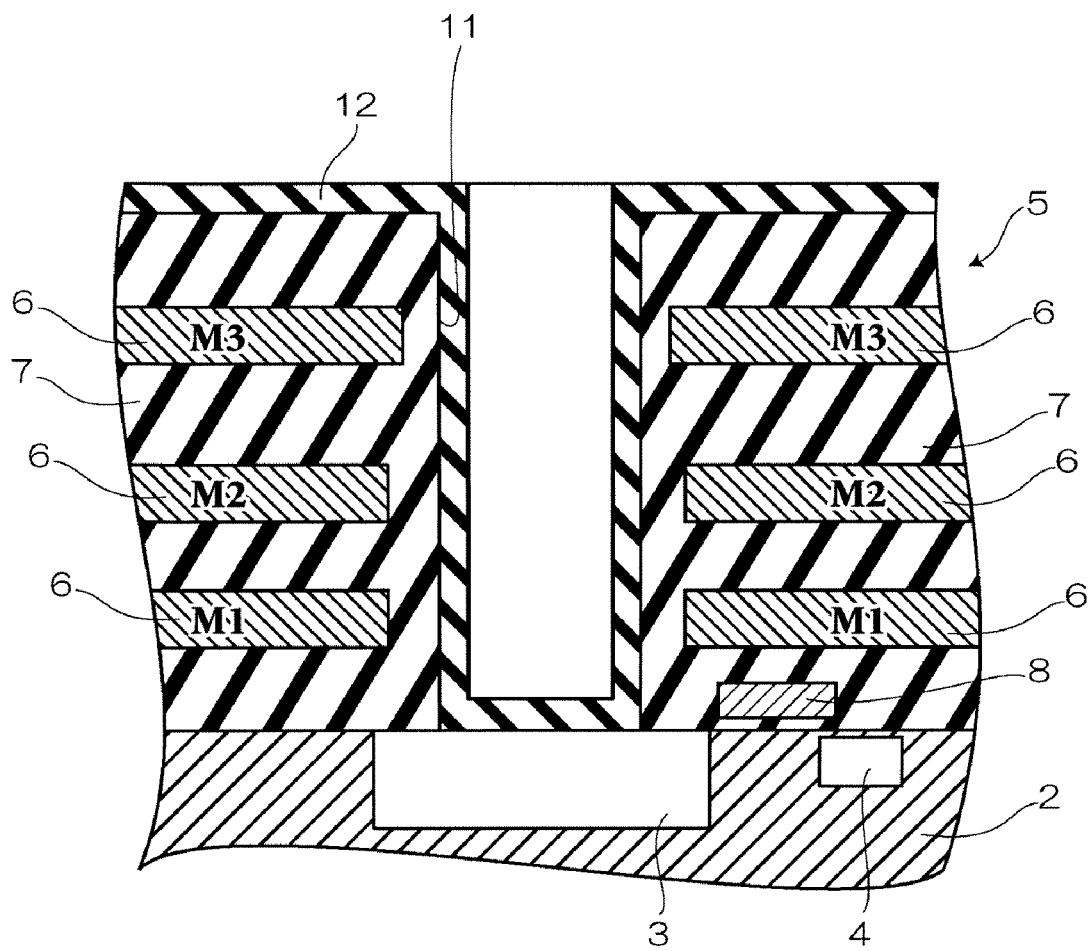
FIG. 4 is a process cross section illustrating a method of manufacturing a CMOS sensor according to the present embodiment.

Next, as shown in FIG. 4, OP-SiN is deposited on the upper surface of the multi-wiring layer 5, and the side wall surface and the bottom surface of the trench 11 by, for example, a CVD method (Chemical Vapor Deposition method) and a nitride film 12 is formed.

Figure 5:
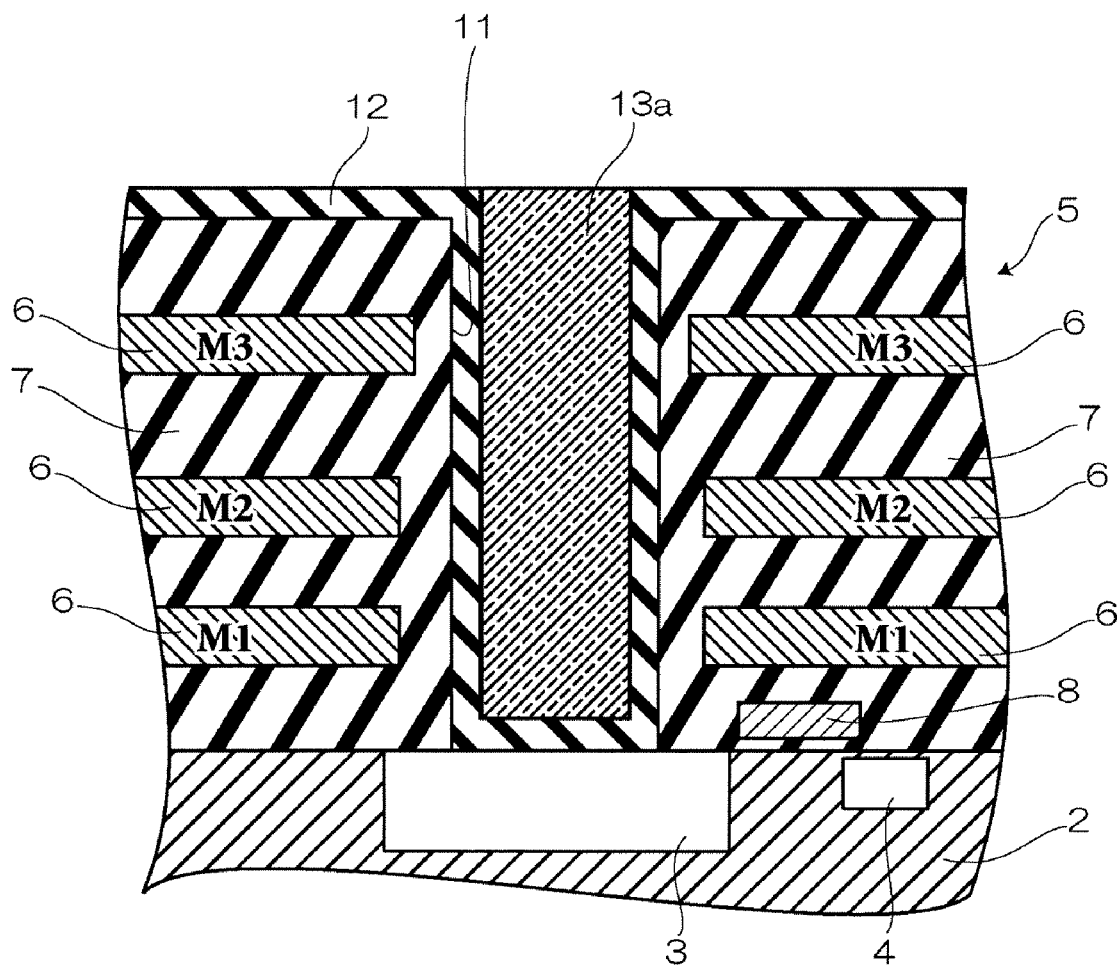
FIG. 5 is a process cross section illustrating a method of manufacturing a CMOS sensor according to the present embodiment.

Next, as shown in FIG. 5, organic material 13a is embedded in the trench 11 so as to fill in by, for example, a coating method. The organic material 13a is based on, for example, coating type organic SOG material, for example, polyimide. It is desirable to use material which a refractive index becomes to be from 1.4 to 1.8 after thermal curing. Next, the organic material 13a adhered onto the multi-wiring layer 5 is removed and the organic material 13a is made to be remained only in the trench 11.

Figure 6:
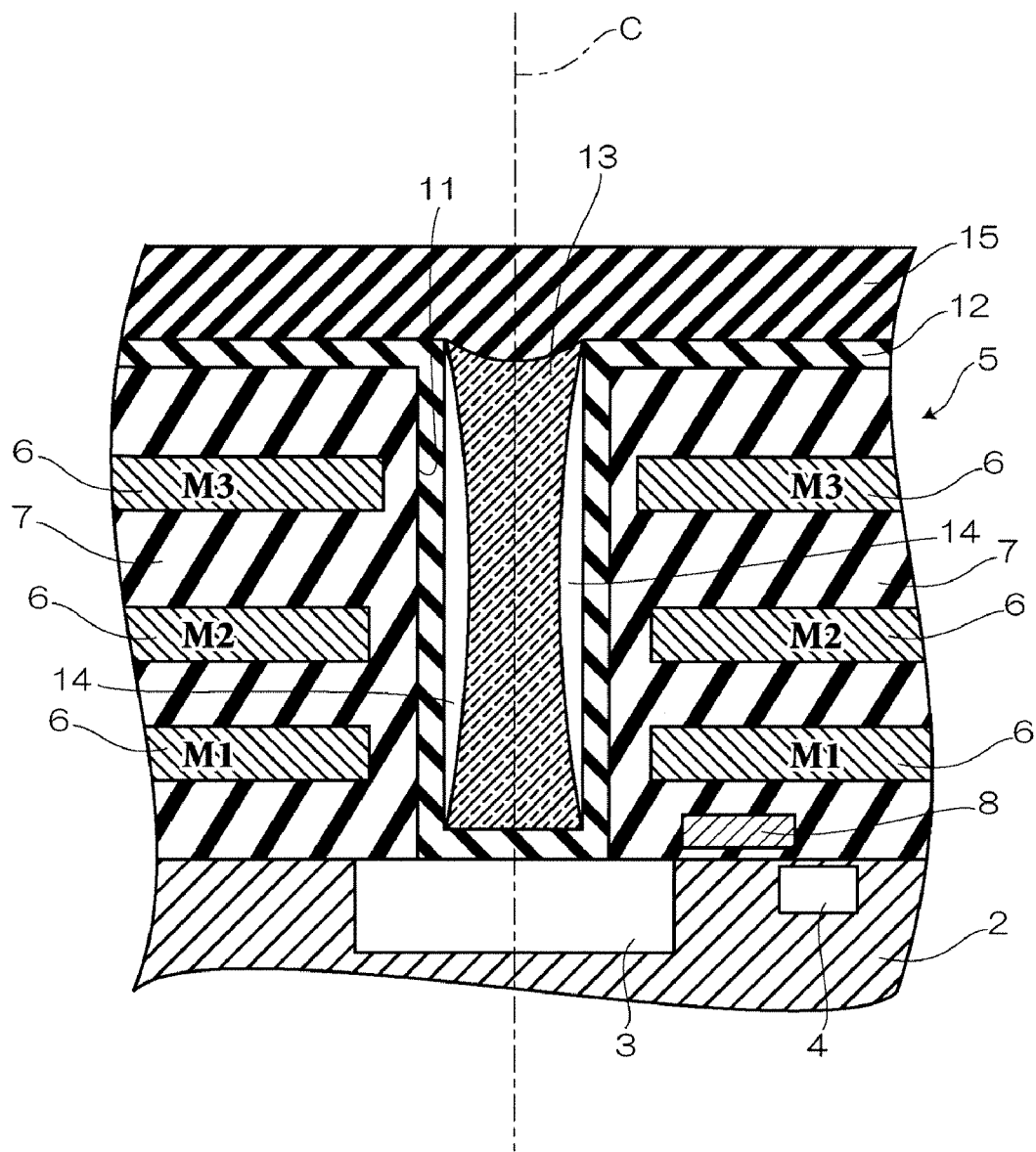
FIG. 6 is a process cross section illustrating a method of manufacturing a CMOS sensor according to the present embodiment.

Next, as shown in FIG. 6, a planarizing film 15 is formed on the multi-wiring layer 5 and the organic material 13a. And then, this structure which is formed up to the planarizing film 15 on the silicon substrate 2 is heated for 30 min. to 1 hour, for example, in nitrogen atmosphere, for example, at temperatures from 200 to 300° C. Thus, the organic material 13a thermally contracted in conjunction with thermal curing, thereby a light guiding member 13 is formed.

At this time, a linear expansion coefficient of OP-SiN forming the nitride film 12 is about $3\times10^{-6}$ (1/K), but the linear expansion coefficient of the organic material 13a such as polyimide is about $4\times10^{-5}$ (1/K), and the linear expansion coefficient of the organic material 13a is higher than the linear expansion coefficient of the nitride 12 by one order. Moreover, an elastic modulus of the organic material 13a is lower than the elastic modulus of the nitride film 12 by about two orders, and is soft. This kind of material factors produce a difference of an amount of thermal contraction during decreasing a temperature in the thermal treatment previously described, and the organic material 13a contracts larger than the nitride film 12. Thus, an empty space 14 is formed between the nitride film 12 and light guiding member 13.

At this time, since the lower surface of the light guiding member 13 is adhered to the silicon substrate 2, the empty space is not formed between the light guiding member 13 and the silicon substrate 2. Moreover, the upper surface of the light guiding member 13 is adhered to the planarizing film 15, and a part of the planarizing film 15 is attracted into the trench 11 with thermal contraction of the light guiding member 13, therefore, the empty space is not also formed between the light guiding member 13 and the planarizing film 15. And then since the upper surface and the lower surface of the light guiding member 13 are restrained by the planarizing film 15 and the silicon substrate 2, respectively, the empty space 14 formed between the light guiding member 13 and the nitride film 12 is small at the upper end and the lower end, and becomes larger at the central part along the vertical direction. In other word, the side surface of the light guiding member 13 is curved so that the central part along the vertical direction approaches the center axis C of the trench 11 more than both ends.

After that, as shown in FIG. 2, a color filter 16 is formed on the planarizing film 15 and a micro lens 17 is formed on it. Thus, a CMOS sensor 1 is manufactured.

In the CMOS sensor 1, light incident to the micro lens 17 from above is collected by the micro lens 17, passes through the color filter 16 and is introduced into the light guiding member 13 in the trench 11. At this time, incident light with a relatively small inclination to the center axis C of the trench 11 arrives directly at the photodiode 3 after passing through the light guiding member 13, but incident light along with a direction with an inclination larger than a specified angle (slanting direction) arrives at the side surface of the light guiding member 13, that is, the interface between the light guiding member 13 and the empty space 14. At this time, since the refractive index of the light guiding member 13 is from 1.4 to 1.8 and the refractive index of the air in the empty space 14 is about 1.0, the light arriving at the interface is totally reflected at the interface and brought back into the light guiding member 13. In this way, the light incident into the trench 11 along the slanting direction also finally arrives at the photodiode 3 after repeating reflection at the interface between the light guiding member 13 and the empty space 14. Therefore, the CMOS sensor 1 according to the embodiment has a high efficiency of light collection.

Figure 7:
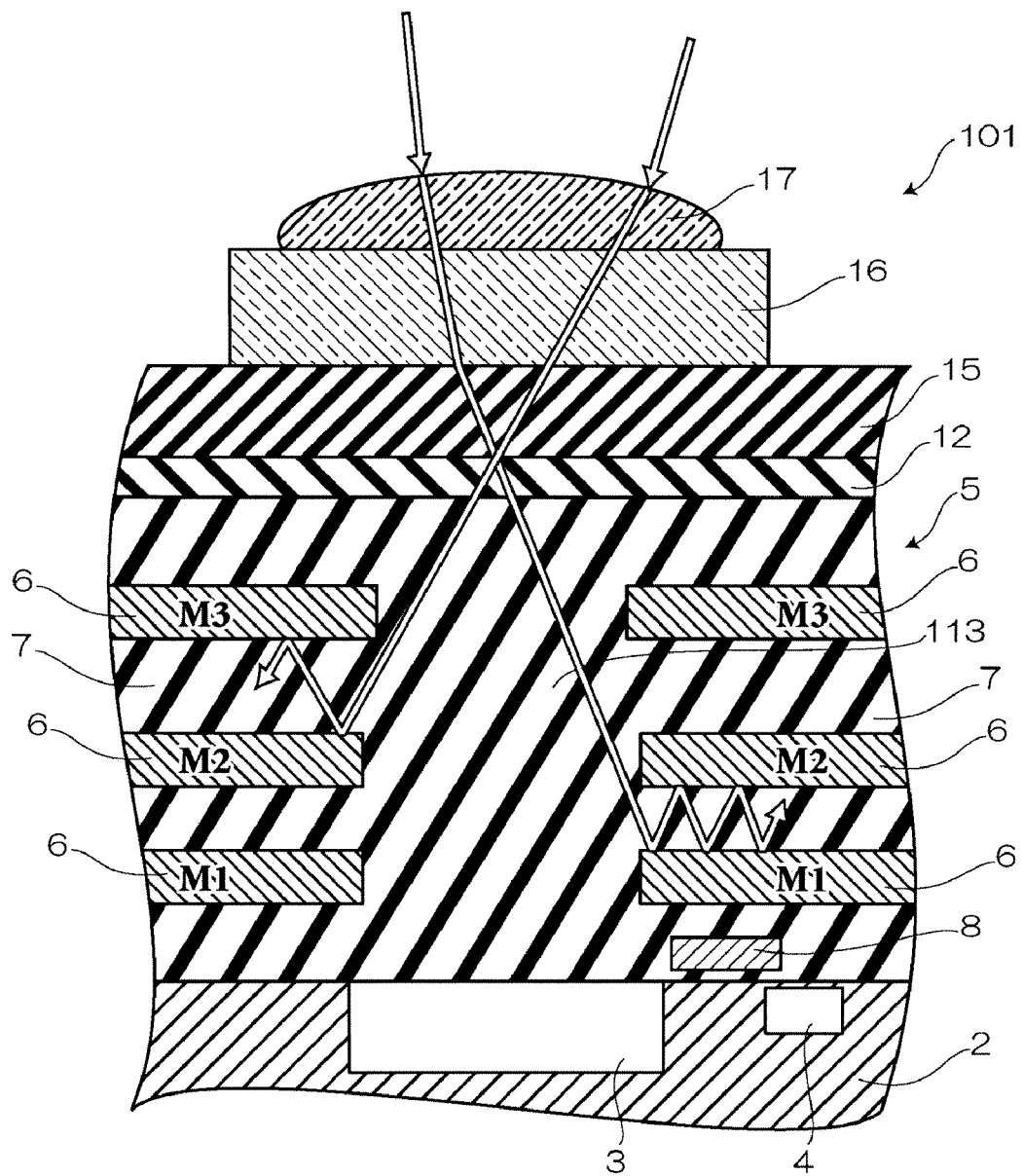
FIG. 7 is a cross section showing a CMOS sensor according to a comparative example of the present invention.

FIG. 7 is a cross section showing a CMOS sensor according to a comparative example of the present invention.

As shown in FIG. 7, in a CMOS sensor 101 according to a comparative example, a light guiding member 113 is made of the same material as the interlayer insulating film 7, for example, $SiO_2$. Therefore, the light guiding member 113 and the interlayer insulating film 7 are unified, an empty space is not formed on the side surface of the light guiding member 113. In this case, incident light along a slanted direction among incident light into the light guiding member 113 after passing through the micro lens 17 and the color filter 16 is reflected by wirings 6 and does not arrive at the photodiode 3. Therefore, the light collection efficiency of the CMOS sensor 101 is lower than the light collection efficiency of the CMOS sensor 1 according to the embodiment.

In the embodiment, the empty space 14 is formed using a difference of the amount of thermal contraction between the nitride film 12 and the organic material 13a, therefore, the process for formation of the empty space 14 is simple. On this account, a manufacturing cost of the CMOS sensor 1 is low, furthermore, error factors on processing are small and shape stability is high. Moreover, the organic material 13a can be embedded into the trench 11 by coating, therefore, the manufacturing cost of the CMOS sensor 1 is also low in this point. Furthermore, while the nitride film 12 is provided to form the empty space 14 reproducibly using the difference of the amount of thermal contraction between the light guiding member 13 and it, providing the nitride film 12 can also prevent water or the like from penetrating into the multi-wiring layer 5. Thus, damage of wiring 6 by water or the like can be suppressed and reliability of the CMOS sensor 1 is improved. Furthermore, providing the nitride film 12 causes the light leaked into the empty space 14 from the light guiding member 13 by scattering or the like to return to the light guiding member 13 by reflecting at the interface between the empty space 14 and the nitride film 12 and most part of the light to arrive at the photodiode 3 finally. As a result, the light collection efficiency of the CMOS sensor 1 is further enhanced. Furthermore, in the CMOS sensor 1 according to the embodiment, since the side surface of the light guiding member 13 is curved so that the central part along the vertical direction is closer to the center axis C of the trench 11 than both ends, light collection is better than the case forming the empty space with an uniform width.

The shape of the empty space 14 can be controlled by selecting the kind of the organic material 13a and the condition of the heat treatment. For example, when a material with a larger line expansion coefficient is used as the organic material 13a, the empty space 14 can be larger. Moreover, more rapid cooling after curing the organic material 13a allows the empty space 14 to be larger.

Furthermore, in the embodiment, the shape of the trench 11 watched from on high is a square. Thus, the open area ratio can be large and the efficiency taking in light can be higher. But, the shape of the trench 11 watched from on high is not limited to the square, and may be circular. In this case, the light guiding member has a shape of a hand drum.

The invention has been described with illustrating the embodiment, however the invention is not limited to the embodiment. For example, constitution of the multi-wiring layer, shape of the color filter and the micro lens, shape and arrangement of the trench, and circuit configuration or the like that are adapted by modification of design and/or addition of constituting elements by those skilled in the art are encompassed within the scope of the invention.

EXAMPLES

The effect of the invention will now be described specifically with simulation.

Figure 9A:
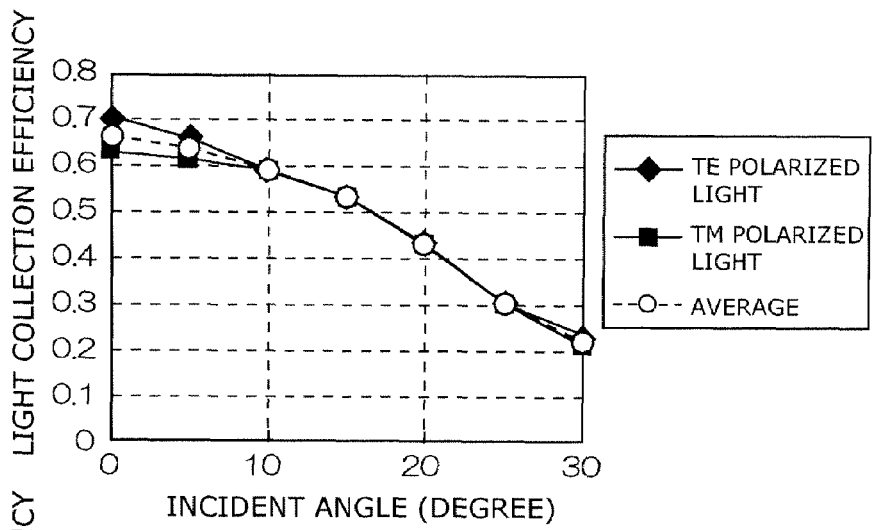
FIGS. 9A to C are graphical diagrams showing results of the present simulation, taking an incident angle on a horizontal axis and taking an efficiency of collecting light on a vertical axis.
Figure 9B:
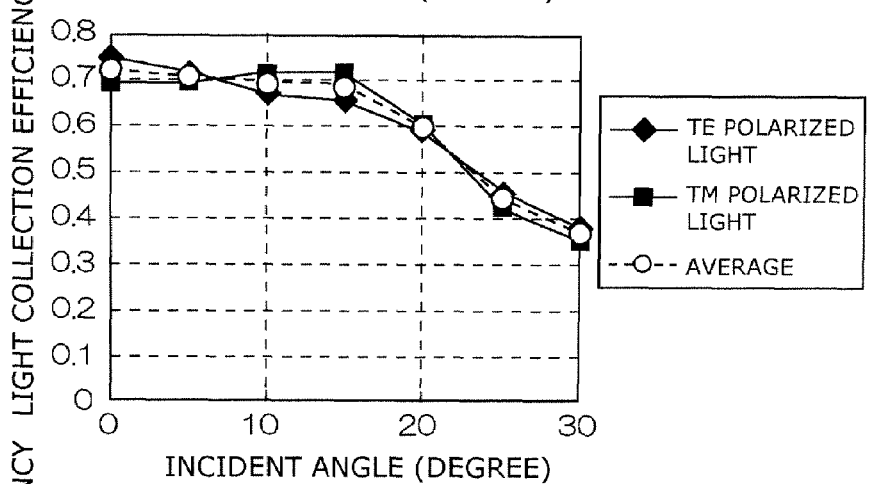
Figure 9C:
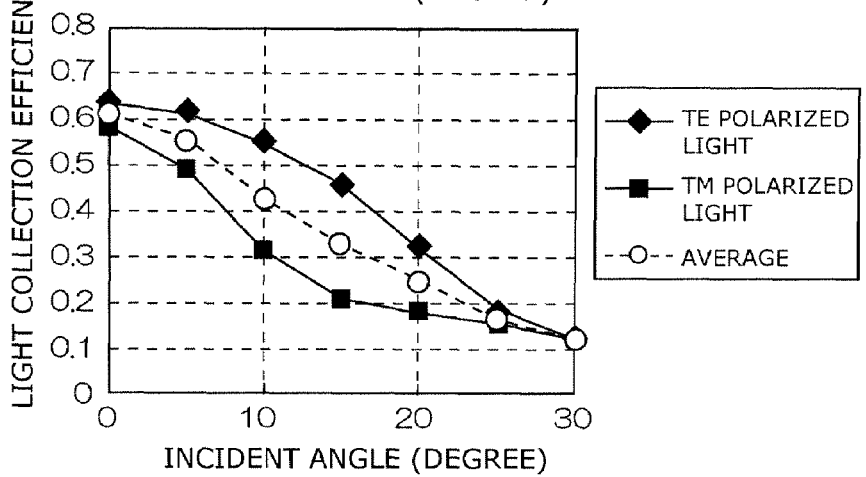

FIGS. 8A to C are cross sections showing CMOS sensors intended for calculation in the present simulation, FIGS. 9A to C are graphical diagrams showing results of the present simulation, taking an incident angle of light on a horizontal axis and taking an efficiency of collecting light on a vertical axis.

As shown in FIG. 8A to C, three kinds of sensor from 201 to 203 are supposed as the CMOS sensor intended for the simulation. As shown in FIG. 8A, in the CMOS sensor 201, only empty space 14 is provided around the light guiding member 23 made of $SiO_2$ and the nitride film is not provided. And as shown in FIG. 8B, in the CMOS sensor 202, the empty space 14 and the nitride film 12 are provided around the light guiding member 23. Furthermore, as shown in FIG. 8C, in the CMOS sensor 203, neither empty space nor nitride film are provided and the interlayer insulating film 7 is formed also directly above the photodiode 3. Thus, in the CMOS sensors 201 and 202, light passes through the light guiding member 23 of $SiO_2$, thereafter is incident on the photodiode 3, and in the CMOS sensor 203, light passes through the interlayer insulating film 7 of $SiO_2$, thereafter is incident on the photodiode 3.

By the way, in the CMOS sensors 201 and 202, the side surfaces of the light guiding member 23 are assumed to be not curved and to extend linearly along the vertical direction. Moreover, the depth of the trench 11 is taken to be 1.95 micrometers, the width of the trench 11 is taken to 1.0 micrometers, and the widths of the empty space 14 are taken to be two levels of 0.1 micrometers and 0.2 micrometers. In addition, an arrangement pitch of the trench 11, that is, a width of 1 cell is taken to be 1.75 micrometers, and a sphere height of the micro lens is taken to be 0.5 micrometers.

Configurations of the CMOS sensors from 201 to 203 other than those described above are assumed to be the same as the CMOS sensor according to the embodiment of the invention described previously.

And then, respective light collection efficiencies on TE polarized light (Transverse Electric polarized light) and TM polarized light (Transverse Magnetic polarized light) of those CMOS sensors are calculated in a range of incident angle from 0 to 30 degrees using a wave equation. By the way, the incident angle is referred to the angle between the light incident direction and the center axis C of the trench 11, for example, the incident angle of the light incident in parallel to the center axis C. Moreover, the light collection efficiency is referred to the ratio of the amount of light arriving at the bottom of the trench 11 to the amount of light incident to the trench 11 or a region corresponding to it. Furthermore, the calculation is conducted two dimensionally in the plane including the center axis C of the trench 11.

As shown in FIG. 9A, for the CMOS sensor 201 (with the empty space, without the nitride film) the light collection efficiency of the TE polarized light is about 0.70 and the light collection efficiency of the TM polarized light is about 0.63, for the incident angle of 0 degree. Moreover, the light collection efficiency decreases monotonically with increase of the incident angle, and the light collection efficiencies of the TE polarized light and the TM polarized light are both about 0.43, for the incident angle of 20 degrees. In addition, the results are the same for the widths of the empty space of 0.1 micrometers and 0.2 micrometers.

Moreover, as shown in FIG. 9B, for the CMOS sensor 202 (with the empty space, with the nitride film) the light collection efficiency of the TE polarized light is about 0.76 and the light collection efficiency of the TM polarized light is about 0.70, for the incident angle of 0 degree. And for the incident angle of 20 degrees, the light collection efficiencies of the TE polarized light and the TM polarized light are both about 0.60. Furthermore, the results are the same for the widths of the empty space of 0.1 micrometers and 0.2 micrometers. In this way, the light collection efficiency of the CMOS sensor 202 is higher than the light collection efficiency of the CMOS sensor 201 for both of the TE polarized light and the TM polarized light in the total range of the incident angle from 0 to 30 degrees. With this, it is noticed that providing the nitride film around the empty space increases the light collection efficiency. On the contrary, as shown in FIG. 9C, for the CMOS sensor 203 (without the empty space, without the nitride film) the light collection efficiency of the TE polarized light is about 0.62 and the light collection efficiency of the TM polarized light is about 0.58, for the incident angle of 0 degree. Moreover, the light collection efficiency decreases monotonically with increase of the incident angle, and the light collection efficiencies of the TE polarized light is about 0.32 and the light collection efficiency of the TM polarized light is about 0.19, for the incident angle of 20 degrees. In this way, the light collection efficiency of the CMOS sensor 203 is lower than the light collection efficiencies of the CMOS sensors 201 and 202 for both of the TE polarized light and the TM polarized light in the total range of the incident angle from 0 to 30 degrees. With this, it is noticed that providing the nitride film around the light guiding member increases the light collection efficiency.

The invention claimed is:

1. A solid-state imaging device comprising:
a substrate;
a photo-receiving portion formed in the substrate;
a wiring layer formed on the substrate and having a trench being formed on a region directly above the photo-receiving portion; and
a light guiding member provided in the trench and made of organic material,
an empty space being formed between a side wall of the trench and a side surface of the light guiding member, and
the side surface of the light guiding member being curved so that a central part of the side surface along a vertical direction is closer to a center axis of the trench than both end parts of the side surface along the vertical direction.

2. The solid-state imaging device according to claim 1 further comprising a nitride film covering the side surface of the trench,
the empty space being formed between the nitride film and the light guiding member.

3. The solid-state imaging device according to claim 1, wherein a refractive index of the light guiding member is in a range from 1.4 to 1.8.

4. The solid-state imaging device according to claim 1, wherein the photo-receiving portion is arranged in a matrix configuration.

5. The solid-state imaging device according to claim 1, wherein the wiring layer includes a plurality of conductive layers.

6. The solid-state imaging device according to claim 5, wherein adjacent conductive layers are insulated by an interlayer insulating film.

7. The solid-state imaging device according to claim 2, wherein the organic material has a larger line expansion coefficient than the nitride film and a lower elastic modulus than the nitride film.

8. The solid-state imaging device according to claim 1, wherein the empty space is filled with air or nitrogen.

9. The solid-state imaging device according to claim 1, further comprising a transfer circuit provided in a vicinity of the photo-receiving portion in the substrate.

10. The solid-state imaging device according to claim 9, further comprising a gate electrode provided directly above a region between the photo-receiving portion and the transfer circuit.

11. The solid-state imaging device according to claim 2, further comprising a planarizing film provided on the nitride film and the light guiding member.

12. The solid-state imaging device according to claim 11, further comprising a color filter provided on the planarizing film including a region directly above the trench.

13. The solid-state imaging device according to claim 12, further comprising a micro lens provided on the color filter.

14. The solid-state imaging device according to claim 13, wherein the trench, the light guiding member, the color filter and the micro lens have a common center axis.

\* \* \* \* \*